(12) United States Patent
Pan et al.

(10) Patent No.: US 11,978,768 B2
(45) Date of Patent: May 7, 2024

(54) MANUFACTURING METHOD OF SEMICONDUCTOR STRUCTURE

(71) Applicant: Winbond Electronics Corp., Taichung (TW)

(72) Inventors: Tseng-Yao Pan, Taichung (TW); Chien-Hsiang Yu, Taichung (TW); Ching-Yung Wang, Taichung (TW); Cheng-Hong Wei, Taichung (TW); Ming-Tsang Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 18/331,190

(22) Filed: Jun. 8, 2023

(65) Prior Publication Data

US 2023/0317781 A1  Oct. 5, 2023

Related U.S. Application Data

(62) Division of application No. 17/207,727, filed on Mar. 21, 2021, now Pat. No. 11,721,720.

(51) Int. Cl.
*H01L 21/308* (2006.01)
*H01L 29/06* (2006.01)

(52) U.S. Cl.
CPC ...... *H01L 29/0657* (2013.01); *H01L 21/3086* (2013.01)

(58) Field of Classification Search
CPC ............ H01L 21/3086; H01L 29/0653; H01L 29/0657; H10B 41/50
See application file for complete search history.

(56) References Cited

U.S. PATENT DOCUMENTS

2017/0345679 A1* 11/2017 Kwon ................. H01L 21/3086

* cited by examiner

*Primary Examiner* — Walter H Swanson
(74) *Attorney, Agent, or Firm* — JCIPRNET

(57) ABSTRACT

A method manufacturing of a semiconductor structure including following steps is provided. A material layer is provided. A first mask layer is formed on the material layer. Core patterns are formed on the first mask layer. A spacer material layer is conformally formed on the core patterns. An etch-back process is performed on the spacer material layer. A portion of the spacer material layer located on two ends of the core pattern is removed, then spacer structures are formed. Each spacer structure includes a merged spacer and a non-merged spacer. The core patterns are removed. The first patterned mask layer is formed to cover a portion of the merged spacer and expose another portion of the merged spacer and the non-merged spacer. The first patterned mask layer and the spacer structure are used as a mask, and the first mask layer is patterned into a second patterned mask layer.

14 Claims, 11 Drawing Sheets

MANUFACTURING METHOD OF SEMICONDUCTOR STRUCTURE

CROSS-REFERENCE TO RELATED APPLICATION

This application is a divisional application of and claims the priority benefit of U.S. application Ser. No. 17/207,727, filed on Mar. 21, 2021. The entirety of the above-mentioned patent application is hereby incorporated by reference herein and made a part of this specification.

BACKGROUND

Field of the Disclosure

The disclosure relates to a semiconductor structure and a manufacturing method thereof, and more particularly to a semiconductor structure and a manufacturing method thereof that can prevent disconnection.

Description of Related Art

Currently, the component of some semiconductor devices (e.g., flash memory) is provided with a rail pattern and an array pattern connected to the rail pattern. The array pattern can be defined by the self-alignment double patterning (SADP) process, and the rail pattern can be defined by another patterned photoresist layer.

However, in the process of using the patterned mask layer and the patterned photoresist layer as the mask to define the rail pattern and the array pattern, because the patterned photoresist layer is located in the rail area and covers the patterned mask layer in the rail area, and the portion of the patterned mask layer in the array area adjacent to the rail area is etched at a faster etching rate in the etching process, so sub-trenches are often formed in this portion, which in turn damages or breaks the patterned mask layer. As a result, the semiconductor structure formed by the patterned mask layer and the patterned photoresist layer is prone to damage or disconnection, thereby reducing the yield and reliability of the semiconductor device.

SUMMARY

The disclosure provides a semiconductor structure and a manufacturing method thereof, which can effectively prevent damage or disconnection from occurring to the semiconductor structure.

A semiconductor structure includes a trunk portion and a branch portion. The trunk portion extends in a first direction. The branch portion is connected to the trunk portion. The branch portion includes a handle portion and a two-pronged portion. The handle portion is connected to the trunk portion and extends in a second direction. The second direction intersects the first direction. The two-pronged portion is connected to the handle portion. A line width of the handle portion is greater than a line width of the two-pronged portion.

The disclosure provides a method for manufacturing a semiconductor structure, including the following steps. A material layer is provided. A first mask layer is formed on the material layer. A plurality of core patterns are formed on the first mask layer. Each core pattern includes a first core and a second core. The second core is connected to the first core. The line width of the first core is greater than the line width of the second core. A spacer material layer is conformally formed on the core pattern. An etch-back process is performed on the spacer material layer to expose the top surface of the core pattern and the top surface of the first mask layer. After performing the etch-back process, the portion of the spacer material layer located on two ends of the core pattern is removed, then the two ends of the core pattern are exposed, and a plurality of spacer structures are formed. Each spacer structure includes a merged spacer and a non-merged spacer. The merged spacer is located between two adjacent first cores. The non-merged spacer is located between two adjacent second cores and connected to the merged spacer. The line width of the merged spacer is larger than the line width of the non-merged spacer. The core pattern is removed. The first patterned mask layer is formed. The first patterned mask layer covers a portion of the merged spacer and exposes another portion of the merged spacer and the non-merged spacer. The first patterned mask layer and the spacer structure are used as a mask, and the first mask layer is patterned into a second patterned mask layer.

Based on the foregoing, in the semiconductor structure provided by the disclosure, the branch portion is connected to the trunk portion through the handle portion, and the line width of the handle portion is greater than the line width of the two-pronged portion. Therefore, the pattern design of the semiconductor structure can effectively prevent the handle portion of the semiconductor structure from being damaged or disconnected due to the sub-trench phenomenon. In addition, in the manufacturing method of the semiconductor structure provided by the disclosure, the first patterned mask layer covers a portion of the merged spacer and exposes another portion of the merged spacer and the non-merged spacer. Since the line width of the merged spacer is greater than the line width of the non-merged spacer (that is, the merged spacer may have a larger line width), in the process of using the first patterned mask layer and the spacer structure as the mask to pattern the first mask layer into the second patterned mask layer, it is possible to effectively prevent the second patterned mask layer from being damaged or disconnected due to the sub-trench phenomenon. In this way, in the subsequent process of transferring the pattern of the second patterned mask layer to the material layer to be patterned to form the semiconductor structure, it is possible to effectively prevent the semiconductor structure from being damaged or disconnected.

In order to make the features and advantages of the disclosure more comprehensible, the following specific embodiments are described in detail with reference to the accompanying drawings.

DETAILED DESCRIPTION OF DISCLOSED EMBODIMENTS

Figure 2:
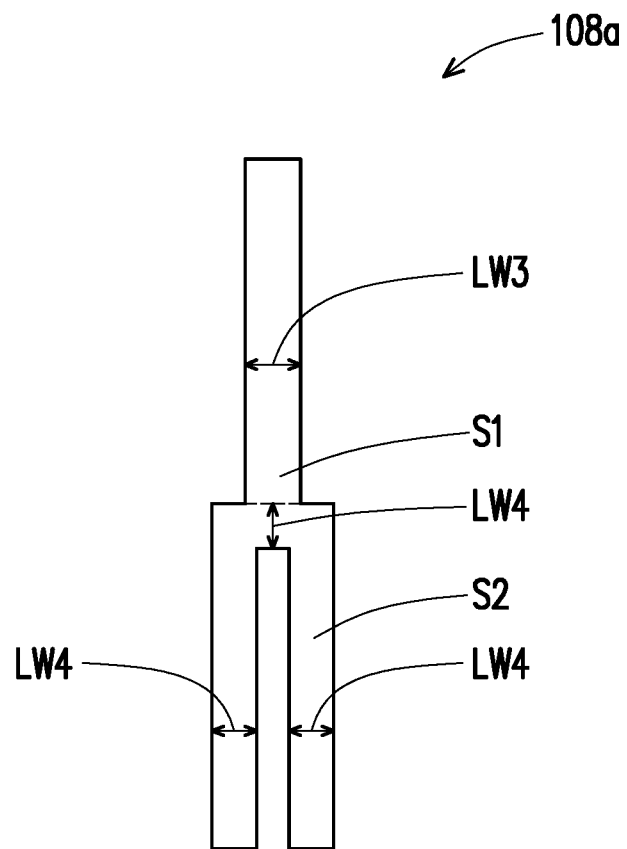
FIG. 2 is a top view of the spacer structure 108a in FIG. 1D.
Figure 3:
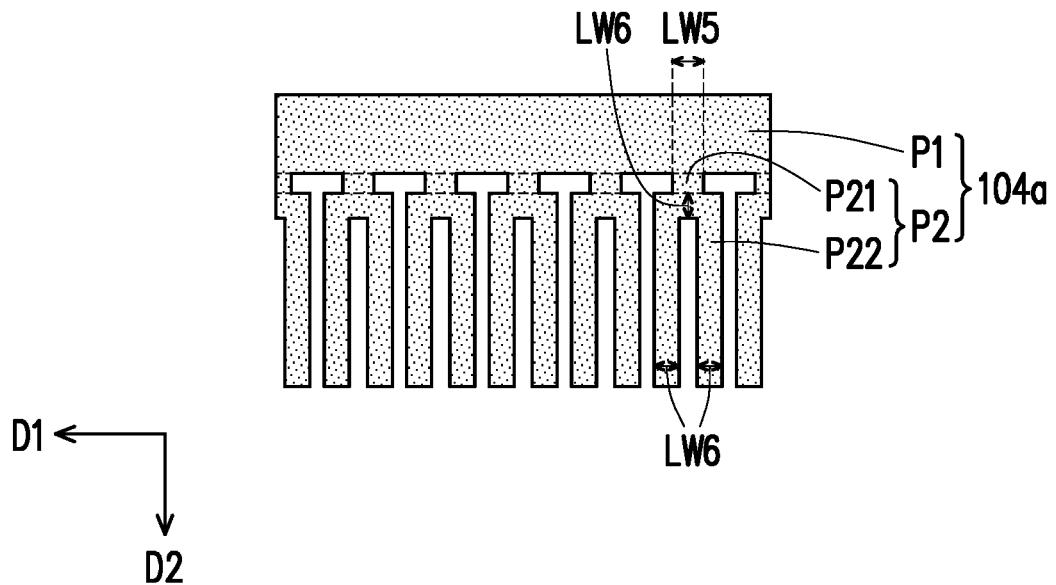
FIG. 3 is a top view of the patterned mask layer 104a in FIG. 1F.
Figure 4:
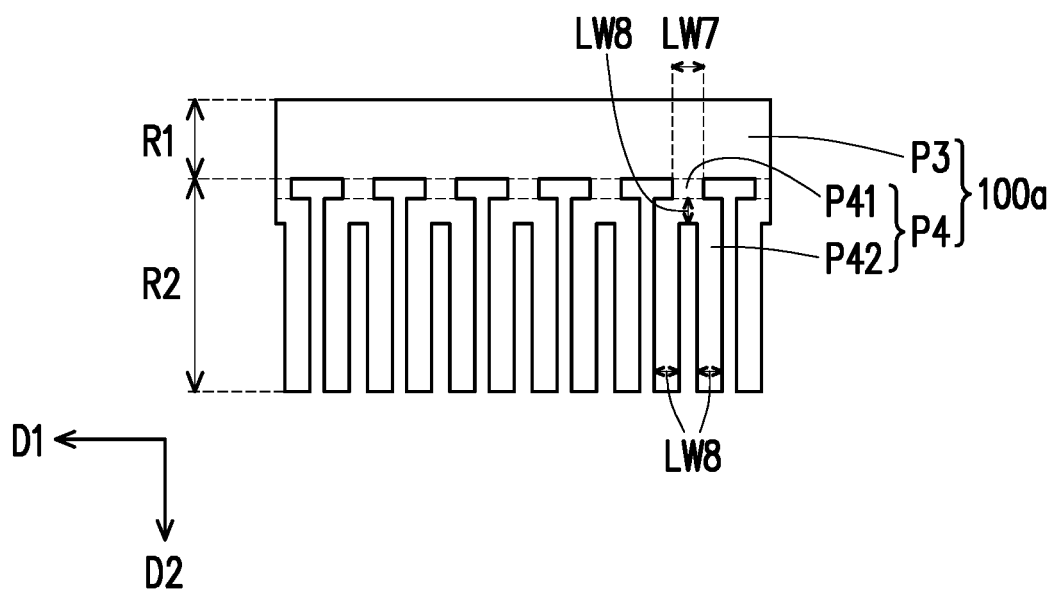
FIG. 4 is a top view of the semiconductor structure 100a in FIG. 1I.

FIG. 1A to FIG. 1I are perspective views of a manufacturing process of a semiconductor structure according to an embodiment of the disclosure. FIG. 2 is a top view of the spacer structure 108a in FIG. 1D. FIG. 3 is a top view of the patterned mask layer 104a in FIG. 1F. FIG. 4 is a top view of the semiconductor structure 100a in FIG. 1I.

Figure 1A:
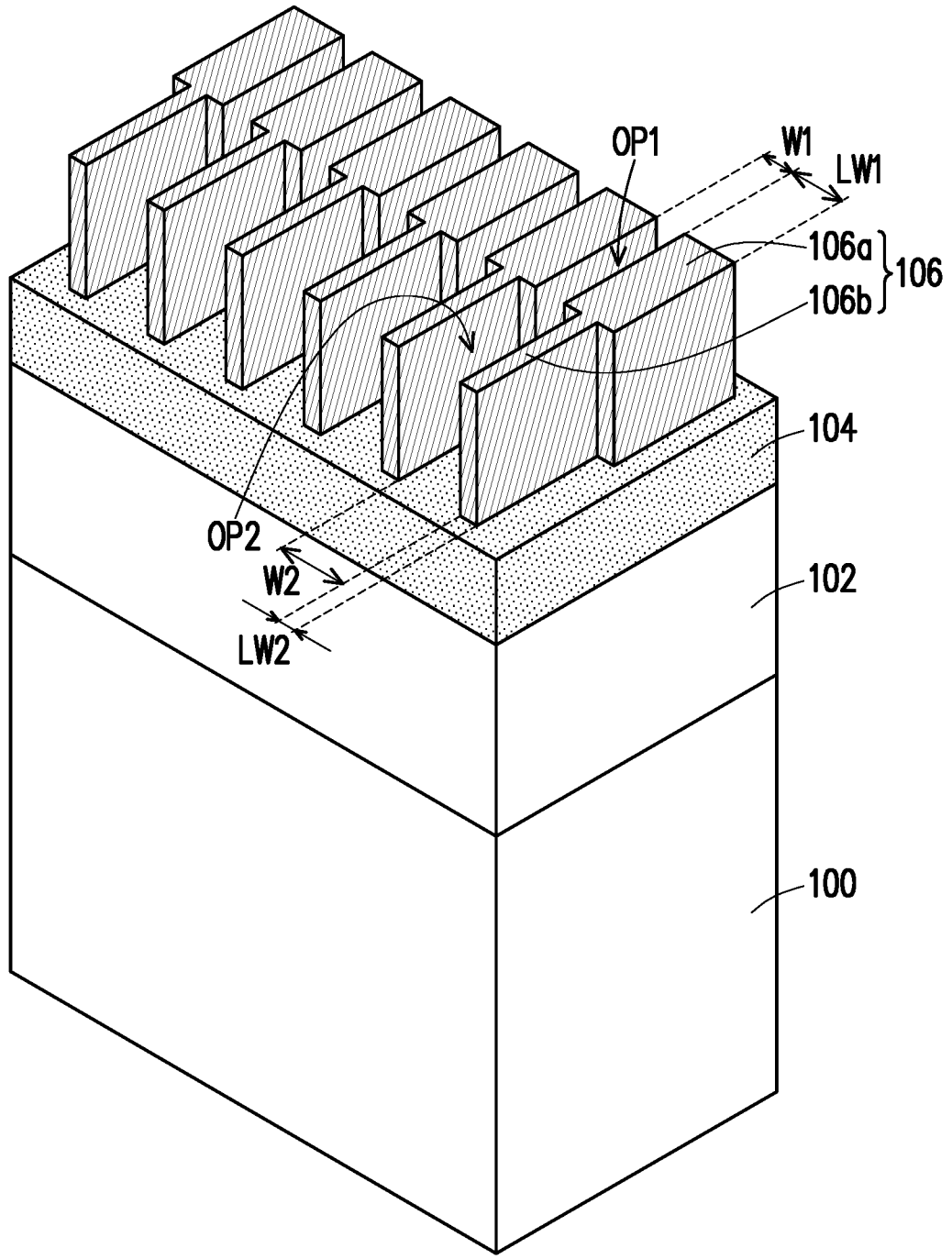
FIG. 1A to FIG. 1I are perspective views of a manufacturing process of a semiconductor structure according to an embodiment of the disclosure.

Please refer to FIG. 1A, a material layer 100 is provided. The material layer 100 can be used to form a predetermined semiconductor structure. That is, the material layer 100 can be patterned to have a predetermined semiconductor structure (for example, the semiconductor structure 100a in FIG. 1I) in a subsequent process. In this embodiment, when the predetermined semiconductor structure is an active area, the material layer 100 may be a semiconductor base (for example, a silicon base), but the disclosure is not limited thereto. In other embodiments, when the predetermined semiconductor structure is a wire, the material layer 100 may be a conductive layer (for example, a metal layer or a doped polysilicon layer, etc.).

Next, a mask layer 102 may be formed on the material layer 100. The material of the mask layer 102 is, for example, oxide (e.g., silicon oxide), but the disclosure is not limited thereto. The method for forming the mask layer 102 is, for example, a chemical vapor deposition method.

Then, a mask layer 104 may be formed on the mask layer 102. The material of the mask layer 104 is, for example, polysilicon, and the disclosure is not limited thereto. The scope sought to be protected by the disclosure involves that the material of the mask layer 104 and the material of the mask layer 102 are etched at different etching rates in the same etching process. The method of forming the mask layer 104 is, for example, a chemical vapor deposition method.

Next, a plurality of core patterns 106 may be formed on the mask layer 104. In some embodiments, a trim process may be performed on the core pattern 106 to further reduce the size of the core pattern 106. The trim process is, for example, a dry etching process. Each core pattern 106 includes a core 106a and a core 106b. The core 106b is connected to the core 106a. The line width LW1 of the core 106a is greater than the line width LW2 of the core 106b. There may be an opening OP1 between two adjacent cores 106a. There may be an opening OP2 between two adjacent cores 106b. The opening OP1 can be connected to the opening OP2. The width W1 of the opening OP1 may be smaller than the width W2 of the opening OP2.

In addition, the core pattern 106 may be a single-layer structure or a multi-layer structure. The material of the core pattern 106 may be carbon, silicon oxynitride (SiON), bottom anti-reflective coating (BARC), or a combination thereof. In this embodiment, the core pattern 106 is exemplified as a single-layer structure made by carbon, but the disclosure is not limited thereto. The core pattern 106 can be formed by a spin coating process, a deposition process, a lithography process, an etching process, or a combination thereof.

Figure 1B:
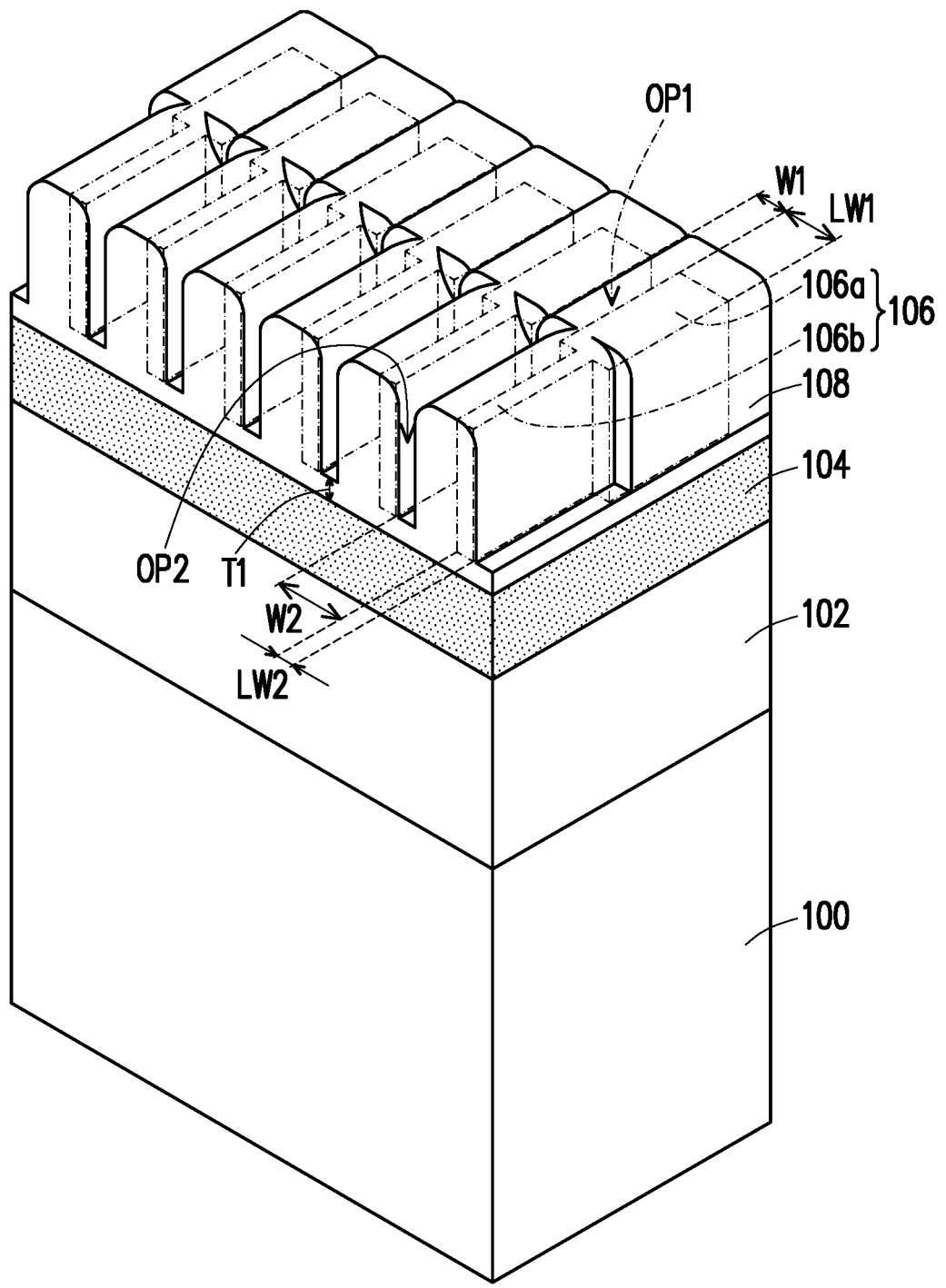

Referring to FIG. 1B, a spacer material layer 108 may be conformally formed on the core pattern 106. The material of the spacer material layer 108 is, for example, oxide (e.g., silicon oxide). The method of forming the spacer material layer 108 is, for example, a chemical vapor deposition method.

In addition, the width W1 of the opening OP1 may be greater than one time of the thickness T1 of the spacer material layer 108 and less than or equal to twice the thickness T1 of the spacer material layer 108. In this way, the adjacent portions of the spacer material layer 108 located on the sidewall of the opening OP1 can be merged together. In some embodiments, the spacer material layer 108 may completely fill the opening OP1. In addition, the width W2 of the opening OP2 may be greater than twice the thickness T1 of the spacer material layer 108. On the other hand, the spacer material layer 108 does not completely fill the opening OP2.

Figure 1C:
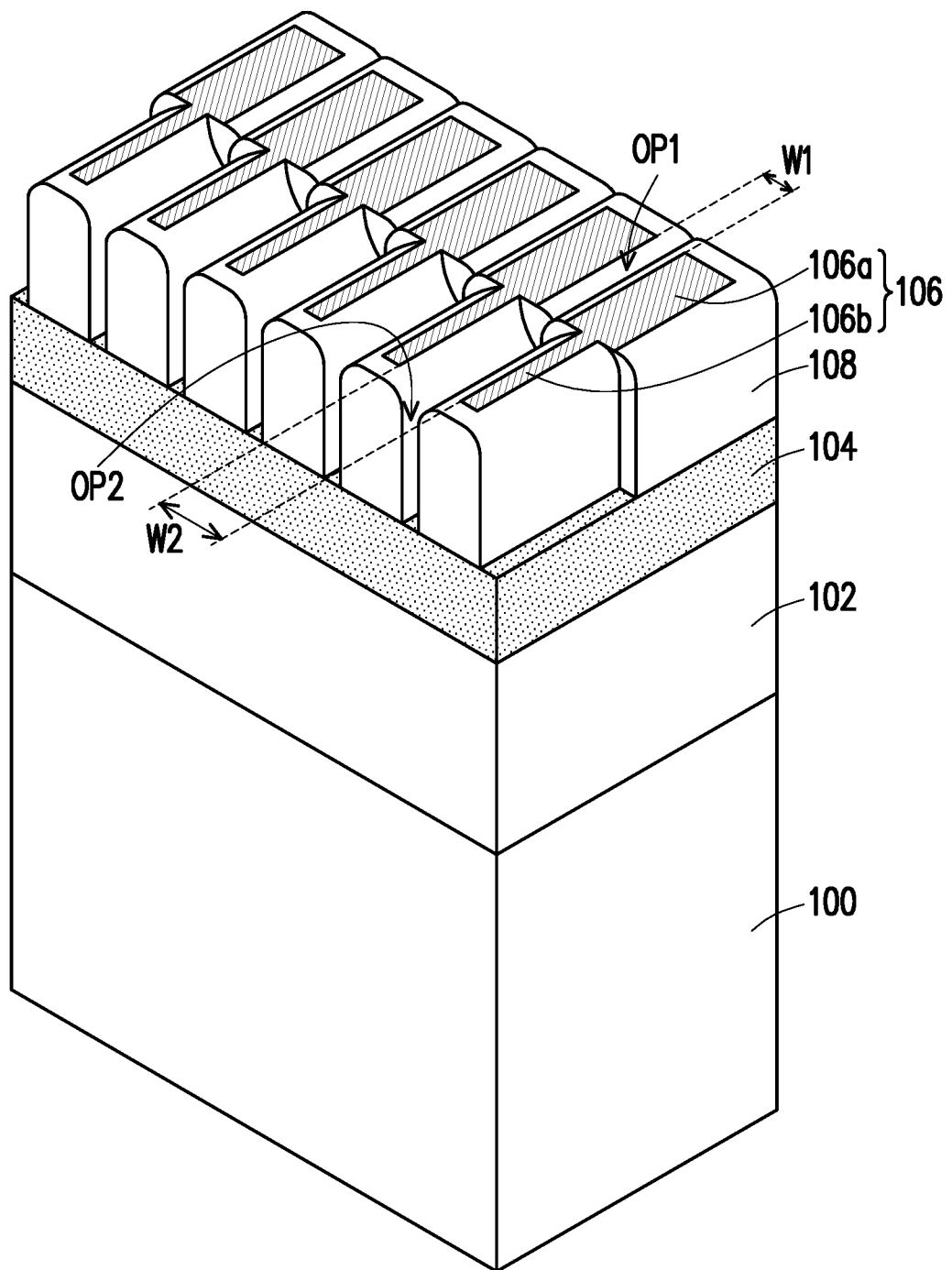

Referring to FIG. 1C, an etch-back process is performed on the spacer material layer 108, and the top surface of the core pattern 106 and the top surface of the mask layer 104 are exposed. The etch-back process is, for example, a dry etching process (e.g., a reactive ion etching (RIE) process).

Figure 1D:
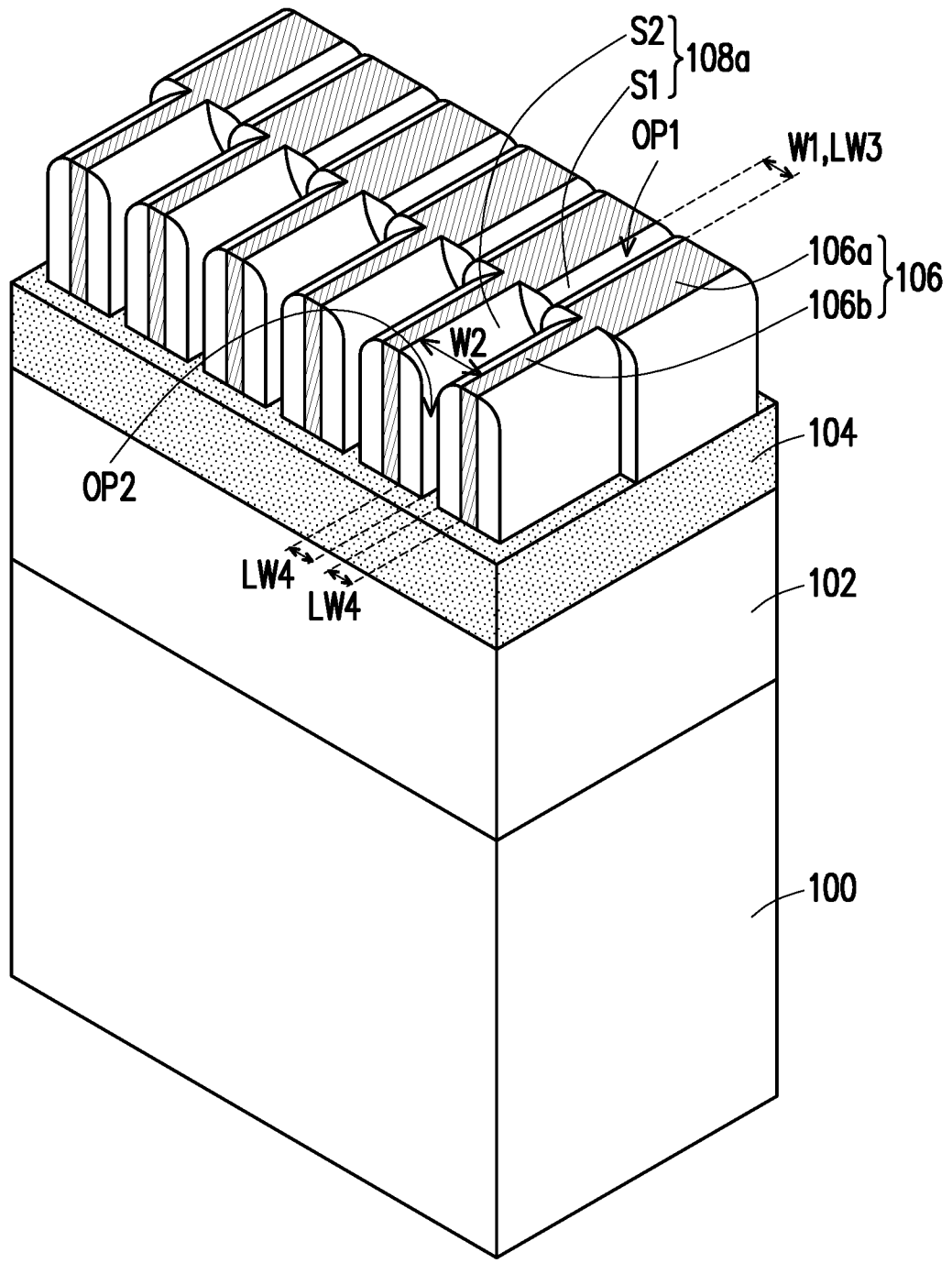

Please refer to FIG. 1D and FIG. 2, after performing the etch-back process, the portion of the spacer material layer 108 located on the two ends of the core pattern 106 is removed, then the two ends of the core pattern 106 are exposed, and a plurality of spacer structures 108a are formed. In this way, a plurality of spacer structures 108a can be formed on the mask layer 104. Each spacer structure 108a includes a merged spacer S1 and a non-merged spacer S2. In this embodiment, the "merged spacer S1" and "non-merged spacer S2" are defined as follows. As shown in FIG. 1B, in the gap filling process for forming the spacer structure 108a, when the width W1 of the opening OP1 is less than or equal to twice the thickness T1 of the spacer material layer 108, the adjacent portions of the spacer material layer 108 located on the sidewall of the opening OP1 can be merged together to form a "merged portion". In the spacer structure 108a, the portion formed by the above-mentioned "merged portion" is defined as "merged spacer S1". In addition, the portion not formed by the above-mentioned "merged portion" is defined as "non-merged spacer S2". The merged spacer S1 is located between two adjacent cores 106a. The non-merged spacer S2 is located between two adjacent cores 106b and connected to the merged spacer S1. The line width LW3 of the merged spacer S1 is greater than the line width LW4 of the non-merged spacer S2. For example, the line width LW3 of the merged spacer S1 may be greater than one time of the line width LW4 of the non-merged spacer S2, and less than or equal to twice the line width LW4 of the non-merged spacer S2. The shape of the non-merged spacer S2 in the top view is, for example, a U shape.

In addition, the method for removing the portion of the spacer material layer 108 located on the two ends of the core pattern 106 may include the following steps, but the disclosure is not limited thereto. A patterned photoresist layer (not shown) is formed on the spacer material layer 108, wherein the patterned photoresist layer exposes the portion of the spacer material layer 108 located on the two ends of the core pattern 106. Then, the patterned photoresist layer is used as a mask, an etching process (e.g., a dry etching process) is performed on the spacer material layer 108, and the portion of the spacer material layer 108 located on the two ends of the core pattern 106 are removed, then the spacer structure 108a is formed. In addition, the patterned photoresist layer can be removed by dry stripping or wet stripping.

Figure 1E:
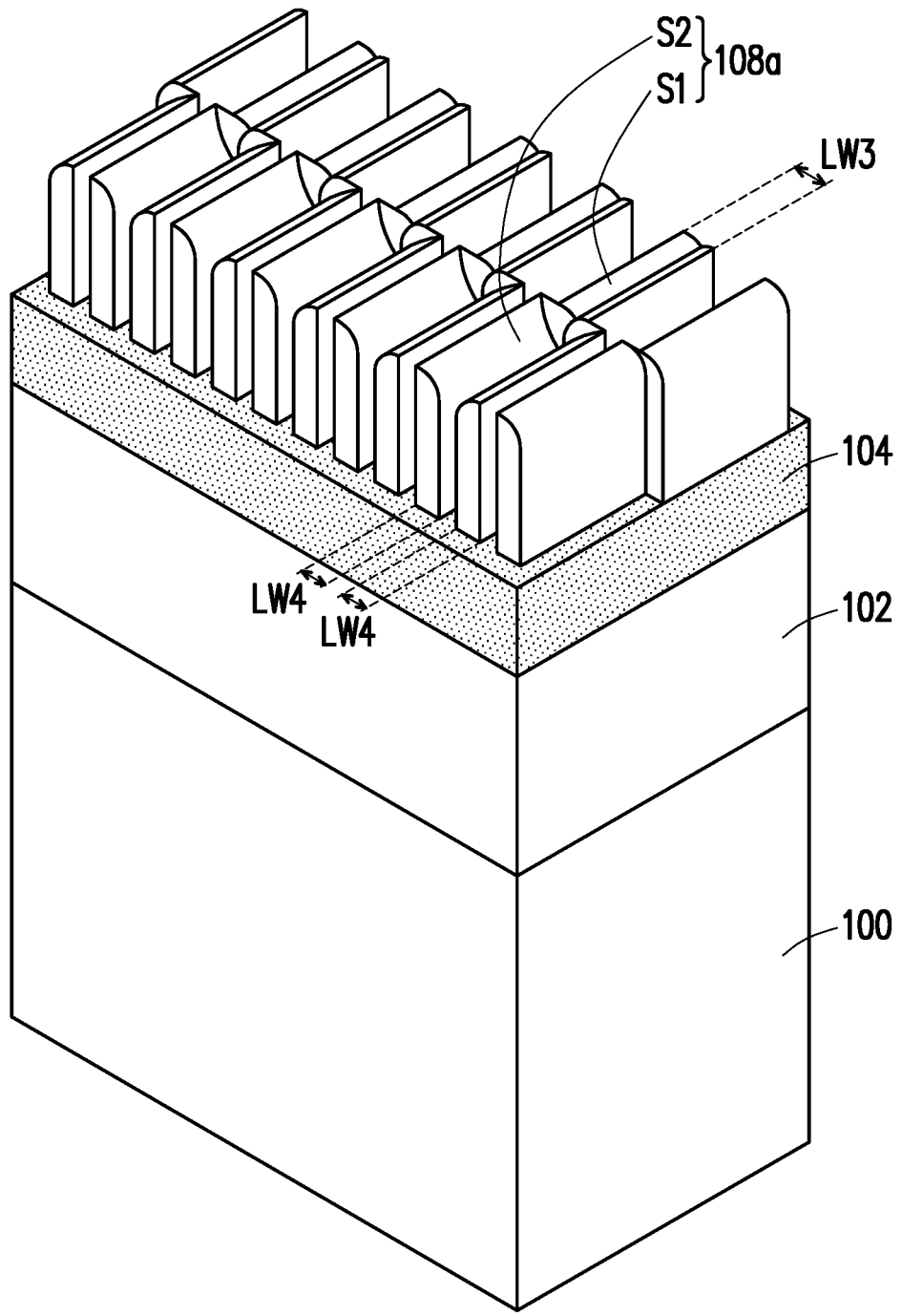

Referring to FIG. 1E, the core pattern 106 is removed. The method of removing the core pattern 106 is, for example, an ashing method, a dry etching method, or a wet etching method. For example, when the material of the core pattern 106 is carbon, the core pattern 106 can be removed by an ashing method.

Figure 1F:
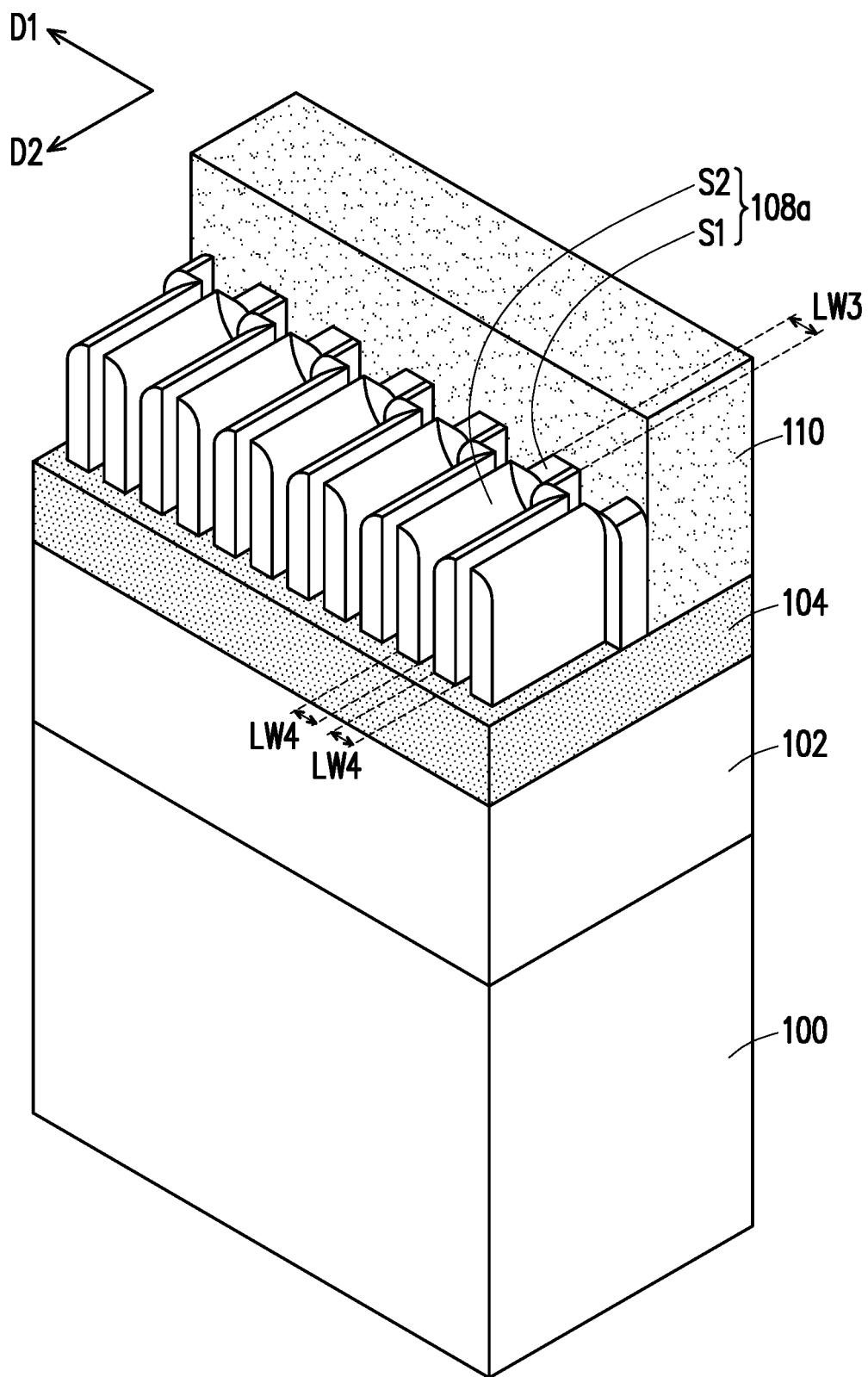

Referring to FIG. 1F, a patterned mask layer 110 is formed. The patterned mask layer 110 covers a portion of the merged spacer S1, and exposes another portion of the merged spacer S1 and the non-merged spacer S2. The patterned mask layer 110 may extend in the first direction D1. The merged spacer S1 may extend in the second direction D2. The second direction D2 may intersect the first direction D1. For example, the first direction D1 may be perpendicular to the second direction D2, but the disclosure is not limited thereto. The patterned mask layer 110 may be a single-layer structure or a multi-layer structure. The material of the patterned mask layer 110 may be spin-on-carbon (SOC), silicon-containing hard-mask bottom anti-reflection coating (SHB), BARC, a photoresist material or a combination thereof. The patterned mask layer 110 may be formed by a spin coating process, a deposition process, a lithography process, an etching process, or a combination thereof. In this embodiment, the patterned mask layer 110 is exemplified as a single-layer structure made by SOC, but the disclosure is not limited thereto.

Figure 1G:
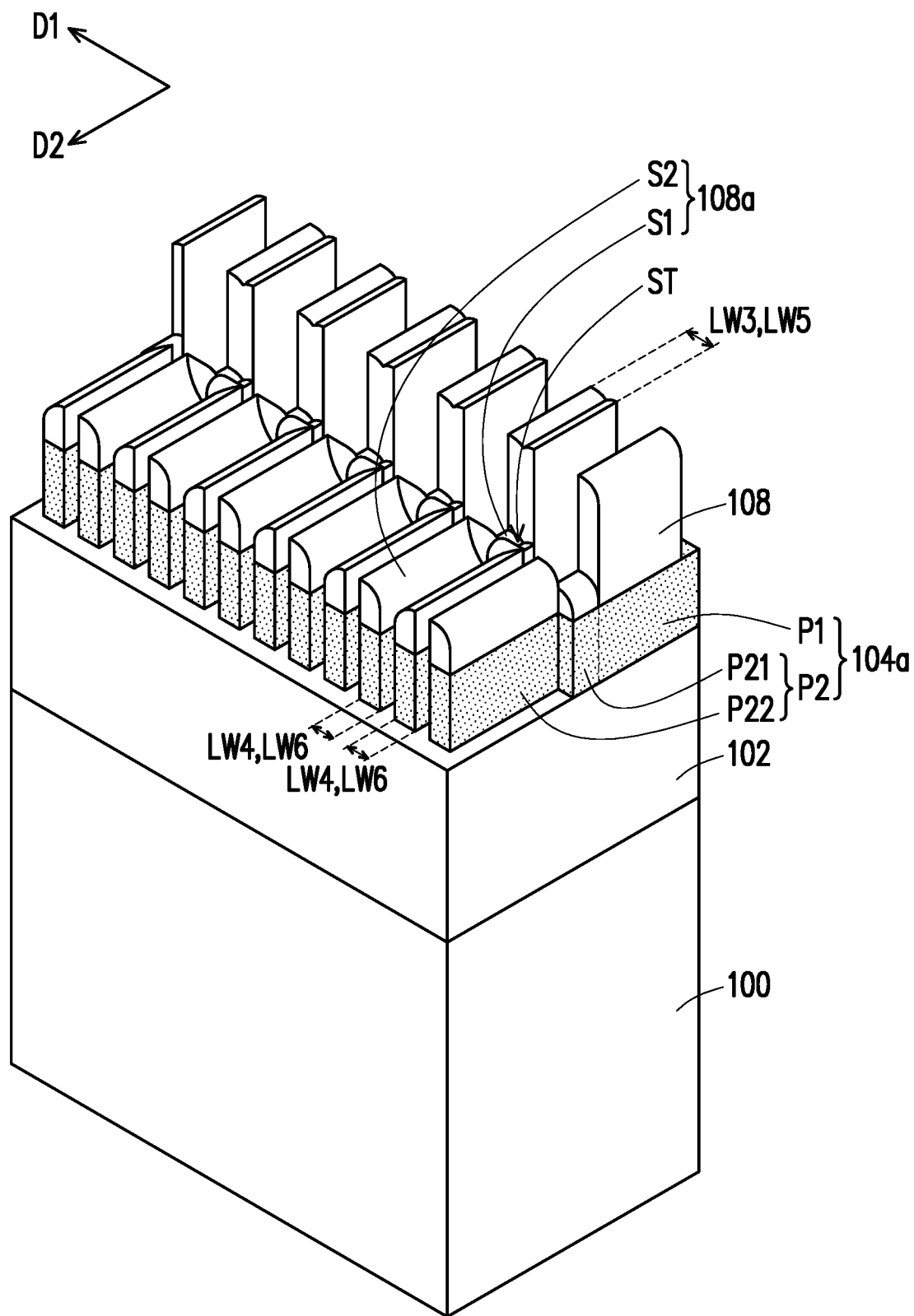

Referring to FIG. 1G, the patterned mask layer 110 and the spacer structure 108a are used as a mask, and the mask layer 104 is patterned into a patterned mask layer 104a. The method for patterning the mask layer 104 into a patterned mask layer 104a is, for example, using the patterned mask layer 110 and the spacer structure 108a as a mask, and performing a dry etching process (e.g., a reactive ion etching process) on the mask layer 104. In some embodiments, since the portion of the merged spacer S1 that is closely adjacent to the patterned mask layer 110 is etched at a faster etching rate in the etching process, a sub-trench ST is likely to be formed in the portion of the merged spacer S1 closely adjacent to the patterned mask layer 110. However, even if the sub-trench ST is formed in the merged spacer S1, since the line width LW3 of the merged spacer S1 is greater than the line width LW4 of the non-merged spacer S2 (that is, the merged spacer S1 may have a larger line width), in the process of using the patterned mask layer 110 and the spacer structure 108a as a mask to pattern the mask layer 104 into the patterned mask layer 104a, it is possible to prevent the spacer structure 108a from being disconnected, thereby effectively preventing the handle portion 21 of the patterned mask layer 104a from being damaged or disconnected due to the sub-trench phenomenon. In this way, in the subsequent process of transferring the pattern of the patterned mask layer 104a to the material layer 100 to be patterned to form the semiconductor structure 100a (FIG. 1I), it is possible to effectively prevent the semiconductor structure 100a from being damaged or disconnected.

In addition, as shown in FIG. 1F, the patterned mask layer 110 covers a portion of the merged spacer S1, and exposes another portion of the merged spacer S1 and the non-merged spacer S2. Therefore, as shown in FIG. 1G, in the process of patterning the mask layer 104 by using the dry etching process, the height of the merged spacer S1 covered by the patterned mask layer 110 may be higher than the height of the merged spacer S1 covered by the unpatterned mask layer 110 and the height of the non-merged spacer S2.

In some embodiments, in the process of patterning the mask layer 104 by using the dry etching process, the patterned mask layer 110 may be removed simultaneously, but the disclosure is not limited thereto. In other embodiments, the patterned mask layer 110 may be removed by an additional process (such as an etching process, etc.).

Referring to FIG. 1G and FIG. 3, the patterned mask layer 104a may include a trunk portion P1 and a branch portion P2. The trunk portion P1 may extend in the first direction D1. The branch portion P2 is connected to the trunk portion P1. The shape of the branch portion P2 in the top view is, for example, a two-pronged shape. The branch portion P2 may include a handle portion P21 and a two-pronged portion P22. The handle portion P21 is connected to the trunk portion P1, and can extend in the second direction D2. The two-pronged portion P22 is connected to the handle portion P21. That is, one end of the handle portion P21 can be connected to the trunk portion P1. The other end of the handle portion P21 can be connected to the two-pronged portion P22. The shape of the two-pronged portion P22 in the top view is, for example, a U shape. The line width LW5 of the handle portion P21 may be greater than the line width LW6 of the two-pronged portion P22. For example, the line width LW5 of the handle portion P21 may be greater than one time of the line width LW6 of the two-pronged portion P22 and less than or equal to twice the line width LW6 of the two-pronged portion P22.

Figure 1H:
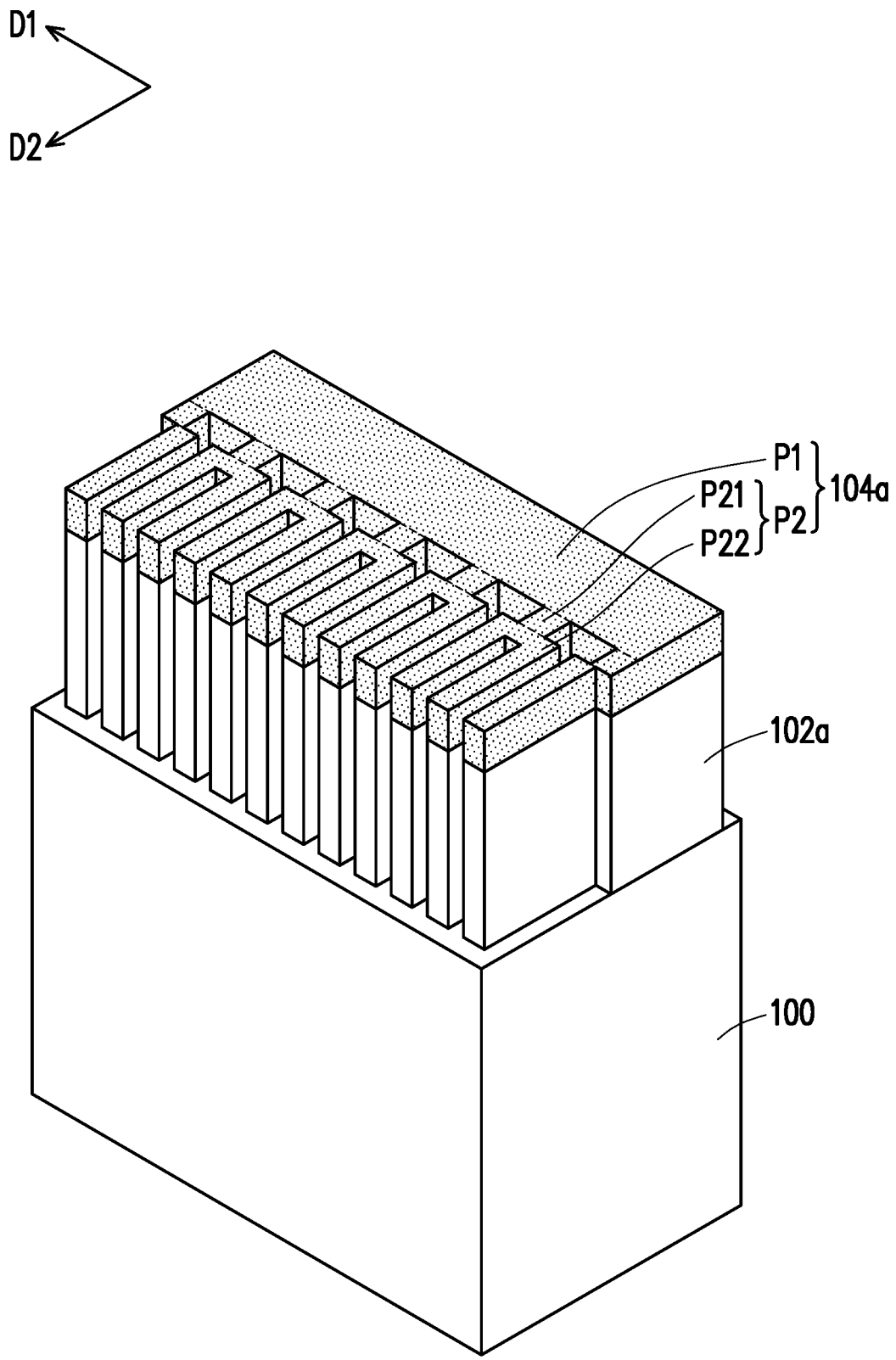
Figure 1I:
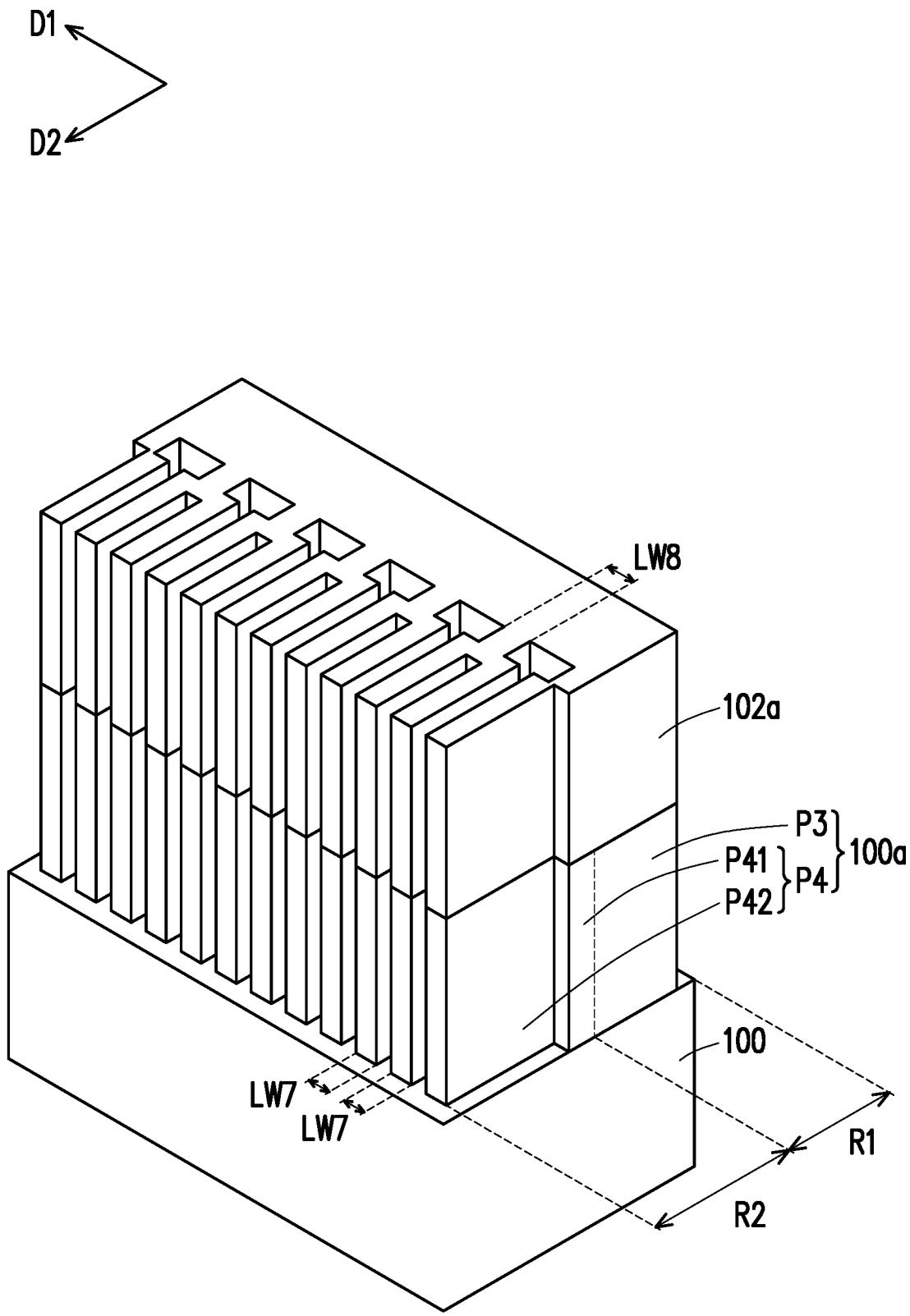

Referring to FIG. 1H and FIG. 1I, the pattern of the patterned mask layer 104a can be transferred to the material layer 100 to form the semiconductor structure 100a. For example, the method of transferring the pattern of the patterned mask layer 104a to the material layer 100 may include the following steps, but the disclosure is not limited thereto. First, as shown in FIG. 1H, the pattern of the patterned mask layer 104a can be transferred to the mask layer 102 to form the patterned mask layer 102a. The method for forming the patterned mask layer 102a is, for example, using the patterned mask layer 104a as a mask, and performing a dry etching process on the mask layer 102. In addition, in the process of patterning the mask layer 102 by using the dry etching process, the spacer structure 108a can be removed simultaneously, but the disclosure is not limited thereto. In other embodiments, the spacer structure 108a can be removed by using an additional etching process. Furthermore, in the process of patterning the mask layer 102 by using a dry etching process, part of the patterned mask layer 104a might be removed, as a result the height of the patterned mask layer 104a is reduced.

Next, referring to FIG. 1I, the pattern of the patterned mask layer 102a can be transferred to the material layer 100 to form the semiconductor structure 100a. For example, the patterned mask layer 104a and the patterned mask layer 102a can be used as a mask to perform a dry etching process on the material layer 100 to form the semiconductor structure 100a. Moreover, in the process of patterning the material layer 100 by using the dry etching process, the patterned mask layer 104a can be removed simultaneously, but the disclosure is not limited thereto. In other embodiments, the patterned mask layer 104a can be removed by using an additional etching process. In addition, after the semiconductor structure 100a is formed, it can be determined to keep or remove the patterned mask layer 102a according to requirements.

In the above manufacturing method of the semiconductor structure 100a, although two mask layers (i.e., the mask layer 102 and the mask layer 104) are used to pattern the material layer 100, the disclosure is not limited thereto. In other embodiments, a mask layer with a single layer or a mask layer with three layers or more can also be used to pattern the material layer 100.

Based on the foregoing embodiment, it can be acquired that in the manufacturing method of the semiconductor structure 100a, the patterned mask layer 110 covers a portion of the merged spacer S1, and exposes another portion of the merged spacer S1 and the non-merged spacer S2. Since the line width LW3 of the merged spacer S1 is greater than the line width LW4 of the non-merged spacer S2 (that is, the merged spacer S1 may have a larger line width), in the process of using the patterned mask layer 110 and the spacer structure 108a as a mask to pattern the mask layer 104 into the patterned mask layer 104a, it is possible to effectively prevent the handle portion 21 of the patterned mask layer 104a from being damaged or disconnected due to the sub-trench phenomenon. In this way, in the subsequent process of transferring the pattern of the patterned mask layer 104a to the material layer 100 to be patterned to form the semiconductor structure 100a, it is possible to effectively prevent the semiconductor structure 100a from being damaged or disconnected.

Hereinafter, the semiconductor structure 100a described in the above-mentioned embodiment will be described with reference to FIG. 1I and FIG. 4. Furthermore, although the method for forming the semiconductor structure 100a is described by taking the above-mentioned method as an example, the disclosure is not limited thereto.

Referring to FIG. 1I and FIG. 4, the semiconductor structure 100a includes a trunk portion P3 and a branch portion P4. In some embodiments, the semiconductor structure 100a may be an active area of a semiconductor base, such as an active area of a flash memory, but the disclosure is not limited thereto. For example, the trunk portion P3 may be located in the rail area R1, and the branch portion P4 may be located in the array area R2. The rail area R1 may correspond to the area where the patterned mask layer 110 in FIG. 1F is located. In other embodiments, the semiconductor structure 100a may be other types of semiconductor structures, such as wires.

The trunk portion P3 extends in the first direction D1. The branch part P4 is connected to the trunk portion P3. As shown in the above embodiment, the semiconductor structure 100a can use a self-alignment double patterning (SADP) process to define the shape of the branch portion P4. The shape of the branch portion P4 in the top view is, for example, a two-pronged shape. The branch portion P4 includes a handle portion P41 and a two-pronged portion P42. The handle portion P41 is connected to the trunk portion P3 and extends in the second direction D2. The second direction D2 intersects the first direction D1. For example, the first direction D1 may be perpendicular to the second direction D2, but the disclosure is not limited thereto. The two-pronged portion P42 is connected to the handle portion P41. That is, one end of the handle portion P41 can be connected to the trunk portion P3. The other end of the handle portion P41 can be connected to the two-pronged portion P42. The shape of the two-pronged portion P42 in the top view is, for example, a U shape. The line width LW7 of the handle portion P41 is greater than the line width LW8 of the two-pronged portion P42. For example, the line width LW7 of the handle portion P41 may be greater than one time of the line width LW8 of the two-pronged portion P42 and less than or equal to twice the line width LW8 of the two-pronged portion P42.

In this embodiment, although the semiconductor structure 100a is exemplified as having a branch portion P4 on a single side of the trunk portion P3, the disclosure is not limited thereto. In some embodiments, the semiconductor structure 100a may have branch portions P4 on both sides of the trunk portion P3.

Based on the foregoing embodiment, it can be acquired that in the semiconductor structure 100a, the branch portion P4 is connected to the trunk portion P3 through the handle portion P41, and the line width LW7 of the handle portion P41 is greater than the line width LW8 of the two-pronged portion P42. Therefore, through the above-mentioned pattern design of the semiconductor structure 100a, it is possible to effectively prevent the handle portion P41 of the semiconductor structure 100a from being damaged or disconnected due to the sub-trench phenomenon.

Although the disclosure has been disclosed as above by way of embodiments, it is not intended to limit the disclosure. Any person with ordinary knowledge in the technical field can make some changes and decorations without departing from the spirit and scope of the disclosure, so the protection scope of the disclosure shall be determined by the scope of the attached claims.

What is claimed is:

1. A manufacturing method of a semiconductor structure, comprising:
   providing a material layer;
   forming a first mask layer on the material layer;
   forming a plurality of core patterns on the first mask layer, and each of the core patterns comprises:
   a first core; and
   a second core, which is connected to the first core, wherein a line width of the first core is greater than a line width of the second core;
   forming a spacer material layer conformally on the core patterns;
   performing an etch-back process on the spacer material layer to expose top surfaces of the core patterns and a top surface of the first mask layer;
   after performing the etch-back process, a portion of the spacer material layer located on two ends of the core patterns is removed, then the two ends of the core patterns are exposed, and a plurality of spacer structures are formed, wherein each of the spacer structures comprises:
   a merged spacer, which is located between two adjacent first cores; and
   a non-merged spacer, which is located between two adjacent second cores and connected to the merged spacer, wherein a line width of the merged spacer is greater than a line width of the non-merged spacer;
   removing the core patterns;
   forming a first patterned mask layer, wherein the first patterned mask layer covers a portion of the merged spacer and exposes another portion of the merged spacer and the non-merged spacer; and
   using the first patterned mask layer and the spacer structures as a mask, and patterning the first mask layer into a second patterned mask layer.

2. The manufacturing method of the semiconductor structure according to claim 1, wherein a shape of the non-merged spacer in a top view comprises a U shape.

3. The manufacturing method of the semiconductor structure according to claim 1, wherein the line width of the merged spacer is greater than one time of the line width of the non-merged spacer, and less than or equal to twice the line width of the non-merged spacer.

4. The manufacturing method of the semiconductor structure according to claim 1, wherein there is a first opening between the two adjacent first cores, and there is a second opening between the two adjacent second cores.

5. The manufacturing method of the semiconductor structure according to claim 4, wherein the first opening is connected to the second opening.

6. The manufacturing method of the semiconductor structure according to claim 4, wherein a width of the first opening is less than a width of the second opening.

7. The manufacturing method of the semiconductor structure according to claim 4, wherein a width of the first opening is greater than one time of a thickness of the spacer material layer and less than or equal to twice the thickness of the spacer material layer.

8. The manufacturing method of the semiconductor structure according to claim 7, wherein adjacent portions of the spacer material layer located on a sidewall of the first opening are merged together.

9. The manufacturing method of the semiconductor structure according to claim 4, wherein a width of the second opening is greater than twice a thickness of the spacer material layer.

10. The manufacturing method of the semiconductor structure according to claim 9, wherein the spacer material layer does not completely fill the second opening.

11. The manufacturing method of the semiconductor structure according to claim 1, wherein the first patterned mask layer extends in a first direction, and the merged spacer extends in a second direction, wherein the second direction intersects the first direction.

12. The manufacturing method of the semiconductor structure according to claim 11, wherein the second patterned mask layer comprises:
   a trunk portion, which extends in the first direction; and
   a branch portion, which is connected to the trunk portion, and the branch portion comprising:
      a handle portion, which is connected to the trunk portion, and extends in the second direction; and
      a two-pronged portion, which is connected to the handle portion, wherein a line width of the handle portion is greater than a line width of the two-pronged portion.

13. The manufacturing method of the semiconductor structure according to claim 12, wherein a shape of the branch portion in a top view comprises a two-pronged shape.

14. The manufacturing method of the semiconductor structure according to claim 1, further comprising:
   transferring a pattern of the second patterned mask layer to the material layer.

* * * * *